United States Patent [19]
Kobayashi et al.

[11] Patent Number: 5,679,204
[45] Date of Patent: Oct. 21, 1997

[54] PLASMA APPARATUS

[75] Inventors: Masayuki Kobayashi, Kochi; Kiyoshi Maeda, Hyogo; Masato Toyota, Tokyo; Hiroshi Ohnishi, Tokyo; Hiroshi Tanaka, Tokyo; Toshio Komemura, Tokyo; Tamio Matsumura, Tokyo, all of Japan

[73] Assignees: Shikoku Instrumentation Co., Ltd., Kagawa; Ryoden Semiconductor System Engineering Corporation, Hyogo; Mitsubishi Denki Kabushiki Kaisha, Tokyo, all of Japan

[21] Appl. No.: 621,527

[22] Filed: Mar. 25, 1996

[30] Foreign Application Priority Data

Sep. 22, 1995 [JP] Japan ................................. 7-244441

[51] Int. Cl.$^6$ ................................................. H01L 21/00
[52] U.S. Cl. ................................. 156/345; 156/643.1
[58] Field of Search .................. 156/345 P, 345 PW, 156/345 WH, 643.1, 657.1; 134/1.2, 1.3; 204/298.31, 298.34

[56] References Cited

U.S. PATENT DOCUMENTS 5,364,496  11/1994  Bollinger et al. .................. 156/345 X

FOREIGN PATENT DOCUMENTS 2-12818  1/1990  Japan .
2-213480  8/1990  Japan .
5-243163  9/1993  Japan .

*Primary Examiner*—William Powell
*Attorney, Agent, or Firm*—Leydig, Voit & Mayer, Ltd.

[57] ABSTRACT

Components such as an earth plate, a gas introduction ring, and the like placed in a reaction chamber in a plasma apparatus are made of aluminum containing magnesium in a concentration of 2.2 to 2.8% by weight and are not coated with alumite. In addition, a heater incorporated in a section of the reaction chamber heats the section during a plasma cleaning process. Further, an electrical discharge chamber is also incorporated in the plasma apparatus for providing a plasma to the reaction chamber for efficient plasma cleaning of the apparatus.

9 Claims, 10 Drawing Sheets

| APPARATUS No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | SUM OF TIMES |
|---|---|---|---|---|---|---|---|---|---|---|---|---|---|---|---|---|---|---|---|---|---|---|---|---|---|---|---|---|---|---|---|---|
| EN52 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 1 |
| EN55 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 1 |
| EN56 | 0 | 0 | 0 | 0 | 0 | 0 | 0 | 0 | 1 | 1 | 0 | 1 | 0 | 0 | 1 | 0 | 0 | 0 | 0 | 0 | 0 | 0 | 0 | 0 | 0 | 0 | 0 | 0 | 0 | 0 | 1 | 4 |
| EN57 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 0 | 1 |
| EN62 | 0 | 0 | 0 | 0 | 0 | 0 | 0 | 0 | 0 | 0 | 0 | 0 | 0 | 0 | 0 | 0 | 0 | 0 | 0 | 0 | 2 | 1 | 2 | 1 | 2 | 2 | 2 | 1 | 0 | 0 | 0 | 13 |
| EN63 | 0 | 0 | 0 | 0 | 0 | 0 | 2 | 0 | 0 | 0 | 0 | 0 | 0 | 0 | 0 | 0 | 0 | 0 | 0 | 0 | 0 | 0 | 0 | 0 | 0 | 3 | 1 | 0 | 0 | 0 | 0 | 6 |
| EN64 | 1 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 2 |
| SUM OF stopping TIMES / DAY | 1 | 0 | 0 | 0 | 0 | 0 | 2 | 0 | 1 | 1 | 0 | 1 | 1 | 0 | 1 | 1 | 0 | 0 | 0 | 0 | 3 | 1 | 2 | 1 | 2 | 5 | 3 | 1 | 0 | 0 | 1 | 28 |

NO ALUMITE: days 1–14
CONTAINING ALUMITE: days 18–28

PLASMA APPARATUS

BACKGROUND OF THE INVENTION

1. Field of the Invention

The present invention relates to a plasma apparatus used for a plasma etching process in a semiconductor device fabrication process, and more particularly, it relates to a plasma apparatus for a plasma etching process using ions and radicals which are generated by changing gasses into a plasma phase.

2. Description of the Prior Art

Figure 11:
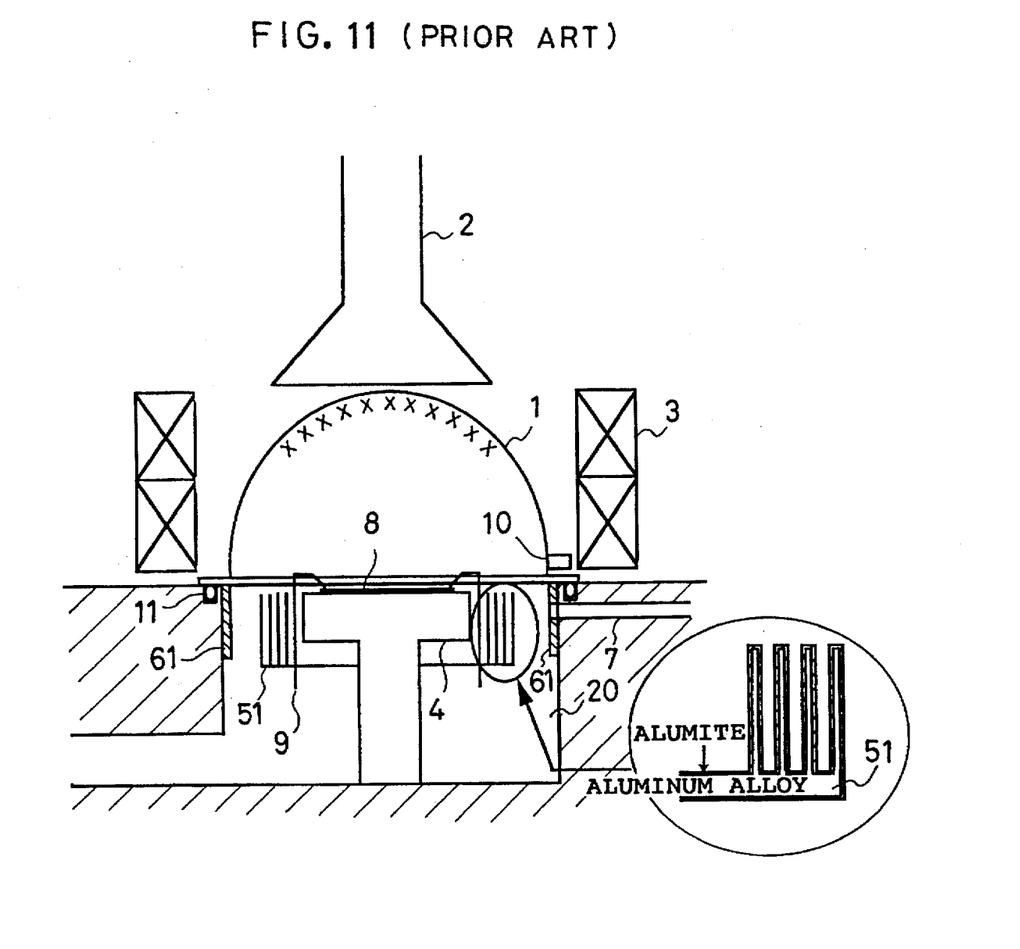
FIG. 11 is a sectional view showing a conventional plasma apparatus.

FIG. 11 is a sectional view showing a conventional plasma apparatus. In FIG. 11, a reference number 1 designates a quartz bell jar for introducing microwave energy into a reaction chamber 20 and forming an upper section of the reaction chamber 20. A reference number 2 denotes a waveguide for transmitting microwave energy to the reaction chamber 20, a reference number 3 designates a solenoid, which is located at a peripheral section of the quartz bell jar 1, for generating an electromagnetic field. A reference number 4 denotes a wafer stage on which a semiconductor wafer 8 is placed. A reference number 51 designates an earth plate which is made of aluminum and which is one electrode (earth electrode) of the electromagnetic field which is supplied to the semiconductor wafer 8. A reference number 61 denotes a gas introduction ring for introducing gasses, such as etching gasses and other gasses, into the reaction chamber 20 through a gas introduction pipe 7. A reference number 9 designates a wafer spring for pushing the semiconductor wafer 8 onto the wafer stage 4. A reference number 10 designates a photo multiplier tube, and a reference number 11 designates a O-shaped ring or a O ring for fastening and sealing the quartz bell jar 1 on the reaction chamber 20 in order to keep a vacuum in the reaction chamber 20.

Next, the operation of the conventional plasma apparatus as shown in FIG. 11 will be explained.

At first, the degree of vacuum in the reaction chamber 20 is kept at approximately $10^{-4}$ Torr. Then, the etching gasses are introduced into the internal section of the gas introduction ring 61 through the gas introduction pipe 7. The introduced etching gasses are carried into the reaction chamber 20 through holes in the gas introduction ring 61 which are formed at the surface of the gas introduction ring 61. In addition, microwave energy is supplied to the reaction chamber 20 through the waveguide 2 and the quartz bell jar 1. The power of the microwave energy is absorbed into electrons of the plasma etching gasses in the reaction chamber 20 at a high rate by using the electron cyclotron resonance in the electromagnetic field generated by the solenoid 3. Accordingly, the state of the etching gasses introduced into the reaction chamber 20 is changed into a plasma state. A high frequency electromagnetic field is supplied between the semiconductor wafer 8 and the earth plate 51. Materials on the surface of the semiconductor wafer 8 vaporize by impact of ions and radicals in the plasma. The vaporized materials fill the reaction chamber 20 and are exhausted from the reaction chamber 20. Thus, the plasma etching process is performed as described above.

Figure 12A:
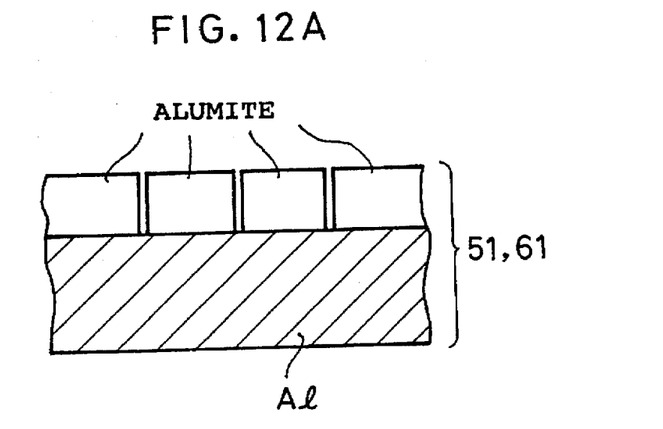
FIG. 12A is a sectional view showing a component which is made of aluminum coated with alumite in the conventional plasma apparatus shown in FIG. 11.
Figure 12B:
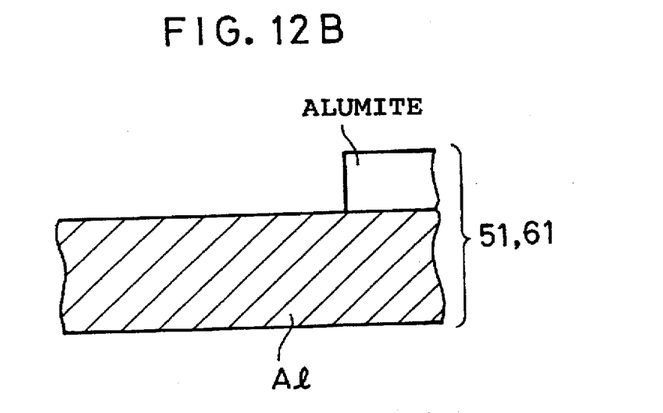
FIG. 12B is a diagram showing alumite debonded from a component consisting of aluminum as shown in FIG. 12A.

When the plasma etching process for the semiconductor wafer 8 is carried out using halogen gasses such as carbon tetrafluorde ($CF_4$) gas, chlorine ($Cl_2$), a bromine ($Br_2$) as the etching gasses, the gas introduction ring 61 is exposed to the plasma, corroded by the halogen gasses, and damaged by sputtering. The earth plate 51, which is also exposed to the plasma and ion bombardment, is also corroded by the halogen gasses and damaged by sputtering. In order to protect the gas introduction ring 61 and the earth plate 51 from damage caused by the halogen gasses and the activated halogen gasses, for example, as disclosed in the Japanese Patent application No. 2-213480, the surfaces of the gas introduction ring 61 and the earth plate 51, which are made up of aluminum, are soaked in an oxalic acid solution to form a corrosion resistant film on the surface of them. This process is called an alumite formation process. Thus, the corrosion resistant film (or an alumite film) becomes an oxide coated positive electrode in the alumite formation process. FIG. 12A is a sectional view showing the surface of the earth plate 51 or the gas introduction ring 61 of aluminum is coated with the alumite film formed by the alumite formation process used in the conventional plasma apparatus as shown in FIG. 11. FIG. 12B is an explanation drawing showing the gas introduction ring 61 or the earth plate 51 in which the alumite film is debonded from the surface of it. In general, as shown in FIG. 12B, the alumite film (or the oxide film) on the surface of a component is debonded after the component is used for a long time. The debonded film adheres to the surface of the semiconductor wafer 8. Thereby, the debonded alumite film reduces the yield of semiconductor chips. In order to prevent the reduction of the yield of the semiconductor chips, the alumite process must be performed again.

By the way, when the plasma etching process is repeated many times, reaction products are generated and a part of them adhere to the internal surface of the reaction chamber 20. For example, as designated by a reference character "x" in FIG. 11, the reaction products adhere to the internal wall of the quartz bell jar 1 which is an introduction section for the microwave energy. Thereby, the plasma etching rate is reduced because the power of the microwave energy is reduced by the adhered reaction products. In addition, the plasma etching rate is also reduced by the reaction between the reaction products and the activated gasses. In order to avoid the reduction of the etching rate caused by the above phenomenon, as disclosed in the Japanese patent application numbers 5-243163 and 2-12818, a plasma cleaning process is performed in which a sulfur hexafluoride ($SF_6$) gas is introduced into the reaction chamber 20 in order to generate a plasma and to eliminate the reaction products of the plasma. This plasma cleaning process is carried out per one lot which includes 25 semiconductor wafers. However, foreign material such as the reaction products or the like are also generated in other materials which form other components in the reaction chamber 20 of the plasma apparatus during the plasma cleaning process.

We summarize problems in the conventional plasma apparatus having the configuration as shown in FIG. 11 as follows:

(1) The alumite films on the surfaces of the gas introduction ring 61 and the earth plate 51 are debonded as foreign matter (see FIGS. 12A and 12B) and then adhered on the semiconductor wafer 8. In order to avoid this, the alumite process must be carried out for the gas introduction ring 61 and the earth plate 51. This reduces the efficiency of the plasma etching process.

(2) In spite of the execution of the plasma cleaning process, the reaction products are adhered to the internal surface of the reaction chamber 20 during the plasma etching processes in several tens of lots. Thereby, light which is transmitted to the photo multiplier 10 is reduced by the reaction products which are adhered to the internal surface of the quartz chamber 1. This causes an error in the detection of the completion time of the plasma etching process. In other words, it is difficult to detect a correct completion time of the plasma etching process. In order to avoid this problem, the operation of the plasma apparatus must be stopped to perform a cleaning process for the reaction chamber 20 every tens of lots (periodic maintenance). No plasma etching process is performed during the cleaning process in the periodic maintenance because the plasma apparatus must be stopped completely. As a result, this causes the reduction of the efficiency of the plasma etching process

SUMMARY OF THE INVENTION

The present invention is invented in order to eliminate the problems encountered in the conventional plasma apparatus.

It is therefore an object of the present invention is to provide a plasma apparatus which reduces the generation of foreign products from components in a reaction chamber even if the plasma etching process and the plasma cleaning process are repeated many times.

In addition, it is another object of the present invention to provide a plasma apparatus in which the processing time can be extended without cleaning. In this case, the cleaning process period becomes long.

Furthermore, it is another object of the present invention to provide a plasma apparatus in which the time required for performing the plasma cleaning process is reduced.

In accordance with one aspect of the present invention, there is provided a plasma apparatus performing a plasma etching process and a plasma cleaning process, comprising: a reaction chamber in which said plasma etching process and said plasma cleaning process are carried out; plasma generation means for generating a plasma in said reaction chamber; a wafer stage located in said reaction chamber; and gas supply means for supplying gasses including a Cl gas and a Br gas into said reaction chamber, wherein a plasma etching is carried out in a plasma activation section in said reaction chamber during said plasma etching process, each of components in said plasma activation section in said reaction chamber is made of an aluminum (Al) containing a magnesium (Mg) and a surface of each of said components is not coated.

In the plasma apparatus as another preferred embodiment of the present invention, said plasma generation means comprises: a waveguide for transmitting a microwave to said reaction chamber; and an earth electrode which is located at an opposite position to said waveguide through said semiconductor wafer, said gas supply means comprises: a gas introduction pipe for introducing said gasses from outside of said plasma apparatus into said reaction chamber; and a gas introduction ring having a plurality of holes through which said gasses are supplied into said reaction chamber, said gas introduction ring is connected to said gas introduction pipe, said earth electrode and said gas introduction ring are located in said plasma activation section, and said earth electrode and said gas introduction ring comprise aluminum (Al) containing magnesium (Mg) and surfaces of said earth electrode and said gas introduction ring are not coated.

Accordingly, because the components such as the earth plate and the gas introduction ring which are exposed to a plasma are made up of aluminum (Al) material containing magnesium (Mg) which is no coated with the alumite, the generation of the foreign products from the components above can be decreased while the plasma etching process and the plasma cleaning process are carried out by using gasses including the Cl gas and the Br gas.

In the plasma apparatus as another preferred embodiment of the present invention, said components in said plasma activation section are made of aluminum (Al) containing magnesium (Mg) of 2.2 to 2.8% in weight. Accordingly, the components such as the earth plate and the gas introduction ring which are exposed to the plasma are made of the aluminum material containing the magnesium (Mg) of 2.2 to 2.8% in weight without any coating film such as the alumite. In addition, the generation of the foreign products from the components above can be decreased while the plasma etching process and the plasma cleaning process are carried out by using gasses including the Cl gas and the Br gas. The degree of the generation of the foreign products in the present invention is smaller than that in the conventional plasma apparatus.

The plasma apparatus as another preferred embodiment of the present invention further comprising heating means for heating a section other than said plasma activation section in said reaction chamber. In addition, said heating means is attached onto components placed in a section other than said plasma activation section other than said wafer stage, said earth electrode and said gas introduction ring. Accordingly, because the heating means (the heater 12) for heating the lower section of the reaction chamber is incorporated in the plasma apparatus, the speed of the plasma cleaning process in the lower section (where it is difficult to transmit efficiency the heat generated by the plasma to the lower section) can be increased.

The plasma apparatus of the present invention further comprises: plasma supply means for performing a plasma discharge and for generating radicals by said plasma discharge and providing said radicals to said reaction chamber during said plasma cleaning. Accordingly, the radicals can be supplied to the outside section separated from the plasma activation section (or the lower section) in the reaction chamber, so that the efficiency of the plasma cleaning process for the lower section of the reaction chamber can be increased.

In the plasma apparatus of the present invention as another preferred embodiment, components located in a section other than said plasma activation section in said reaction chamber are made of aluminum (Al) containing magnesium (Mg) and whose surface is coated with a nickel fluoride (NiF) film. Accordingly, because the surface of the components comprising the aluminum containing the magnesium located at the outside of the plasma activation section (or the lower section of the reaction chamber) is coated with the NiF film having stronger corrosion resistance, the generation of the foreign products from these components can be reduced.

In the plasma apparatus as another preferred embodiment of the present invention, a strong reaction gas is supplied to said reaction chamber through said gas supply means during said plasma cleaning and said gas supply means provides one of a $ClF_3$ gas, a $ClF_3$ gas including Br, a $NF_3$ gas and a $NF_3+F_2$ gas as said strong reaction gas. Accordingly, because the strong reaction gasses such as the $ClF_3$ gas, the $ClF_3$ gas including Br, the $NF_3$ gas, the $NF_3+F_2$ gas and the like are introduced into the reaction chamber to use them for the plasma cleaning gas in addition to the use of the aluminum material containing the magnesium for the components which are exposed to the plasma, the generation of the foreign products from the components can be reduced during the plasma cleaning process.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will now be explained.

EMBODIMENT 1

Figure 1:
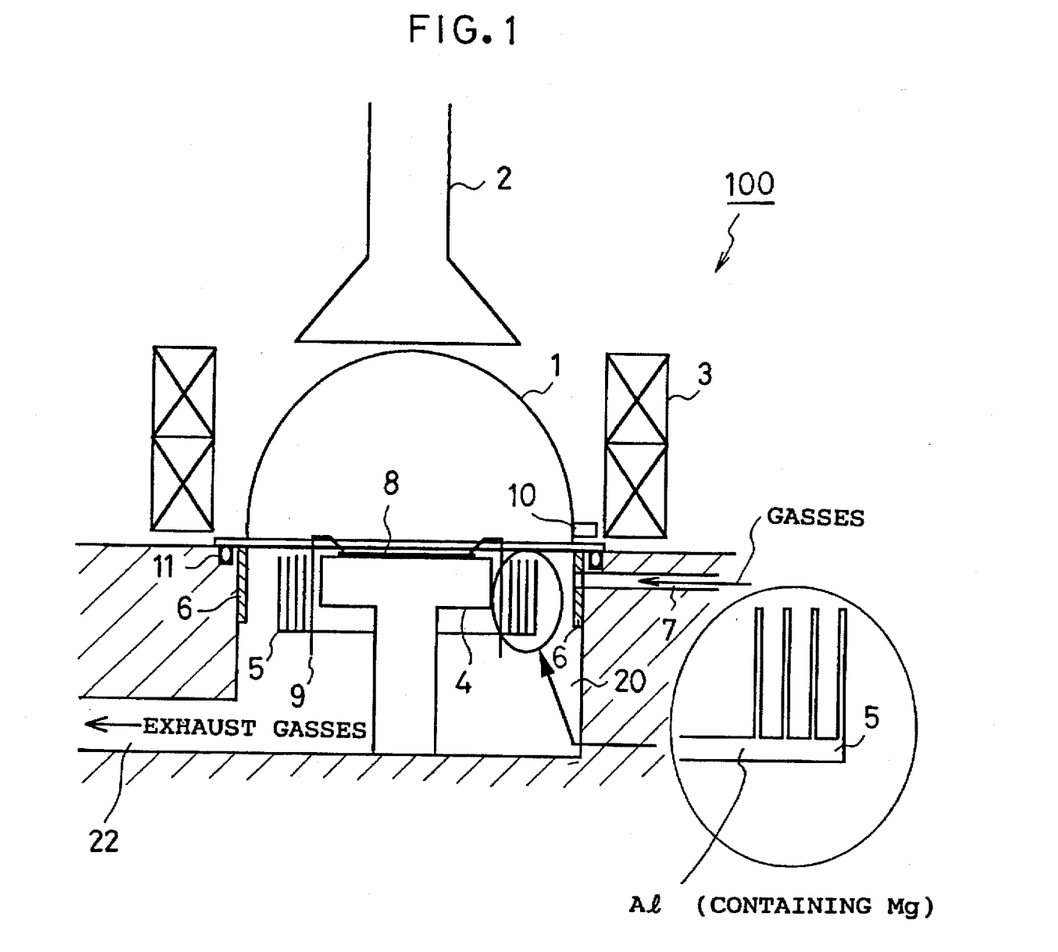
FIG. 1 is a sectional view showing a plasma apparatus of an embodiment according to the present invention.

FIG. 1 is a sectional view showing a plasma apparatus 100 of an embodiment 1 according to the present invention. In FIG. 1, a reference number 1 designates a quartz bell jar for introducing microwave energy into a reaction chamber 20 and forming an upper section of the reaction chamber 20. A reference number 2 denotes a microwave waveguide (plasma generation means) for transmitting microwave energy into the reaction chamber 20, a reference number 3 designates a solenoid (plasma generation means), which is located at a peripheral section of the quartz bell jar 1, for generating an electromagnetic field. A reference number 4 denotes a wafer stage on which a semiconductor wafer 8 is placed. A reference number 5 designates an earth electrode or an earth plate (plasma generation means) of aluminum (Al) containing magnesium (Mg) and which is one electrode of the electromagnetic field which is applied to the semiconductor wafer 8. A reference number 6 denotes a gas introduction ring (gas supply means) of aluminum (Al) containing magnesium (Mg) for introducing gasses such as etching gasses and other gasses into the reaction chamber 20 through a gas introduction pipe 7. A reference number 9 designates a wafer spring for pushing the semiconductor wafer 8 onto the wafer stage 4. A reference number 10 designates a photo multiplier tube for detecting a completion time of a plasma etching process, and a reference number 11 designates a O-shaped ring or a O ring for fastening and sealing the quartz bell jar 1 on the reaction chamber 20 in order to keep a predetermined degree of a vacuum in the reaction chamber 20. A reference number 22 designates a gas exhaust pipe for exhausting reaction products, the etching gasses, and the like from the plasma apparatus 100. Thus, the plasma apparatus 100 of embodiment 1 has the configuration described above. The plasma generation means comprises the microwave waveguide 2, the solenoid 3 and the earth electrode 5. The gas supply means comprises the gas introduction ring 6 and the gas introduction pipe 7.

Next, the operation of the plasma apparatus 100 as shown in FIG. 1 will be explained.

At first, the pressure or the degree of the vacuum in the reaction chamber 20 is kept at approximately $10^{-4}$ Torr. Then, the etching gasses are carried into the internal section of the gas introduction ring 6 through the gas introduction pipe 7. The introduced etching gasses are carried into the reaction chamber 20 through holes in the gas introduction ring 6. In addition, microwave is supplied to the reaction chamber 20 through the waveguide 2 and the quartz bell jar 1. The power of the microwave energy is absorbed into electrons in the plasma etching gasses in the reaction chamber 20 at a high rate by using electron cyclotron resonance in the electromagnetic field generated by the solenoid 3. Accordingly, the state of the etching gasses introduced into the reaction chamber 20 are changed into a plasma state. A high frequency electromagnetic field is supplied between the semiconductor wafer 8 and the earth plate 5. Materials on the surface of the semiconductor wafer 8 vaporize in an ion impact reaction caused by ions in the plasma and by radicals in the plasma. The vaporized materials fill the reaction chamber 20 and are exhausted from the reaction chamber 20 from the plasma apparatus through the gas exhaust pipe 22. Thus, the plasma etching process is performed as described above.

As described in the prior art section, in order to carry out smoothly the semiconductor device fabrication process, it is required to reduce the generation of the foreign matter such as the alumite film and the like in the plasma etching process and the plasma cleaning process. In particular, in order to have the periodic maintenance of the plasma apparatus 100, as long as possible, foreign matter must be reduced to generate the reaction products generated between the plasma used in the plasma cleaning process and the components in the plasma apparatus 100.

Figure 2:
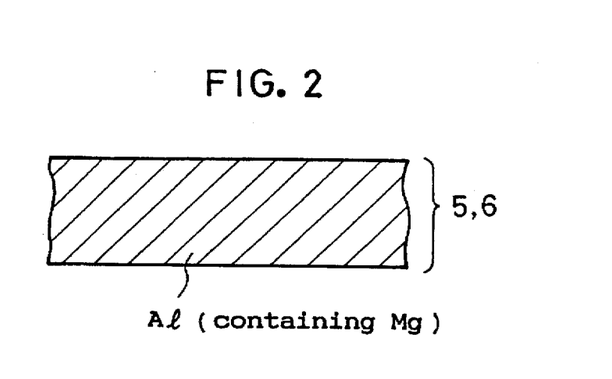
FIG. 2 is a sectional view showing a component which is made of aluminum containing magnesium (Mg) in the plasma apparatus shown in FIG. 1.
Figure 3:
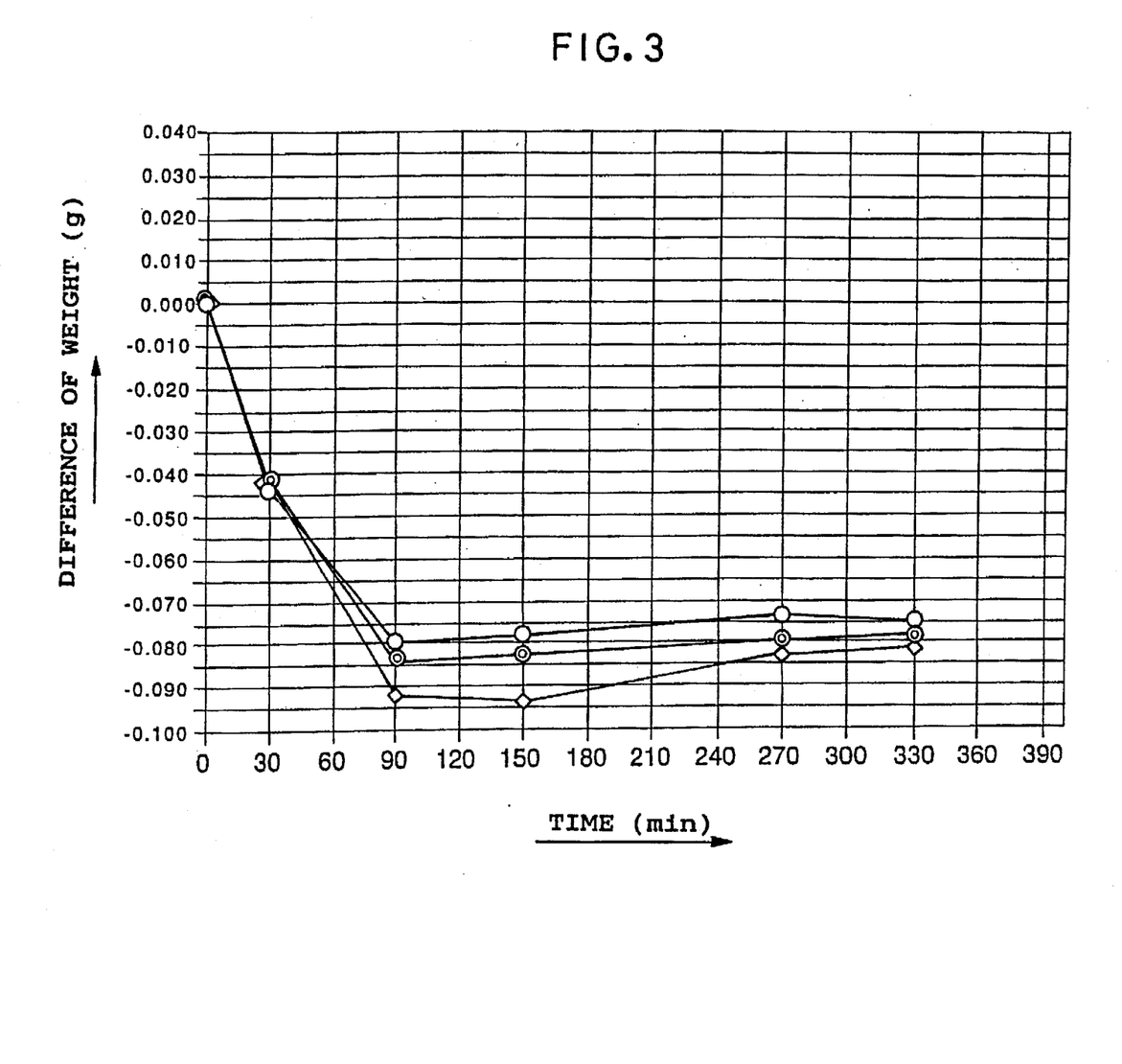
FIG. 3 is a diagram showing the change of weight of several kinds of aluminum materials which are coated with an alumite material when the aluminum materials are exposed to a chlorine trifluoride ($ClF_3$) plasma.
Figure 4:
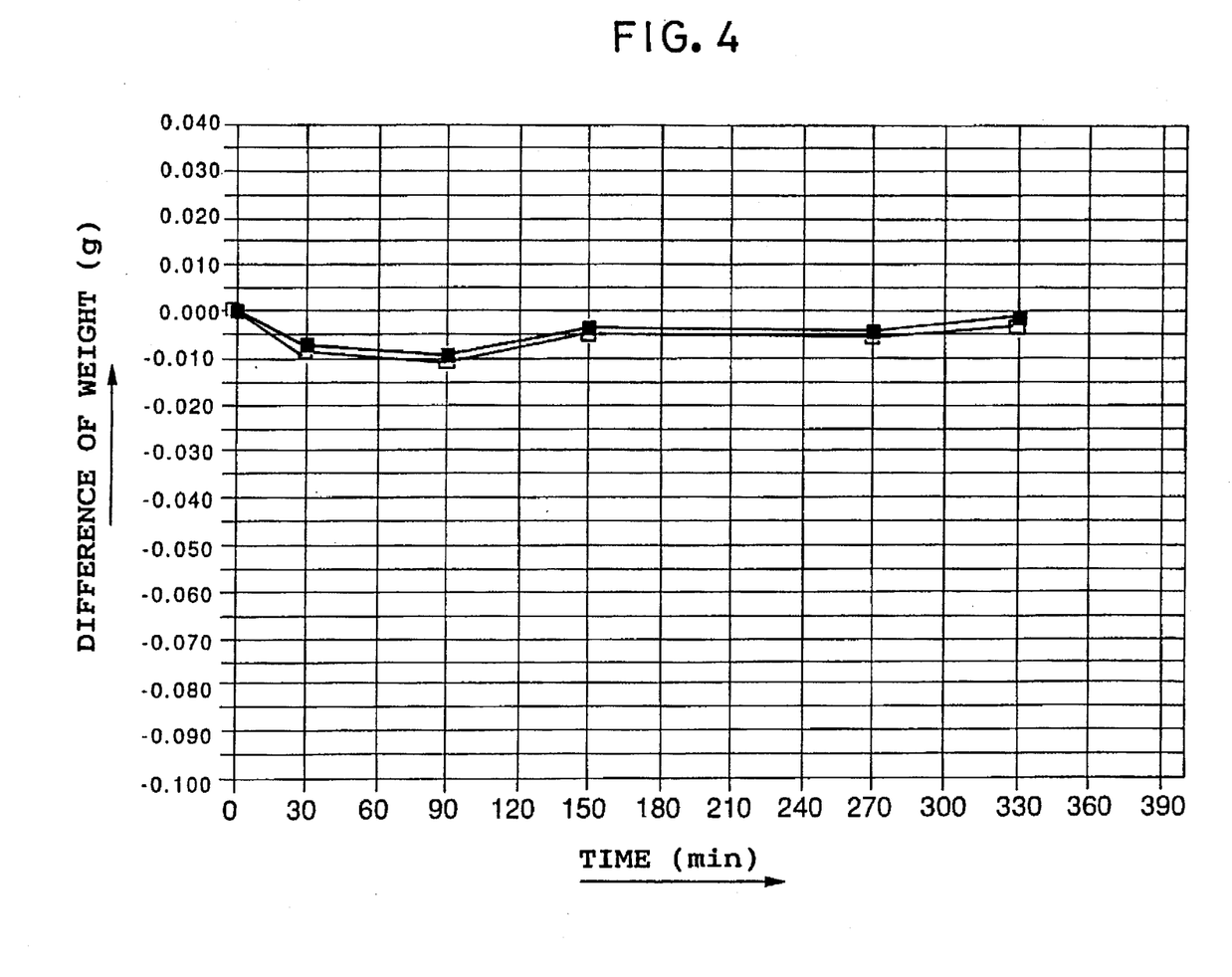
FIG. 4 is a diagram showing the change of weight of several kinds of aluminum materials containing a magnesium (Mg) which are not coated with an alumite material when the aluminum materials are exposed to a chlorine trifluoride ($ClF_3$) plasma.

FIG. 2 is a sectional view showing a component which is made of aluminum containing magnesium (Mg) which is used for the gas introduction ring 6 and the earth electrode 5 in the plasma apparatus shown in FIG. 1. FIG. 3 is a diagram showing the change of weight of several types of aluminum materials which are coated with the alumite material when the aluminum materials are exposed to a chlorine trifluoride ($ClF_3$) plasma. FIG. 4 is a diagram showing the change of weight of several kinds of aluminum materials containing a magnesium (Mg) which are not coated with alumite when the aluminum materials are exposed to a $ClF_3$ plasma gas.

We studied the degree of corrosion of the various types of aluminum materials. As a result of our study, it became clear that the material having the lowest degree of corrosion is the aluminum (Al) material containing magnesium (Mg) in 0.2 to 2.8% as shown in FIG. 2, for example, the 5052 alloy described in Japanese Industrial Standard (JIS). The degree of corrosion of the aluminum (Al) material containing magnesium (Mg) of 0.2 to 2.8% is lower than the aluminum material coated with the alumite.

It is apparently shown in FIGS. 3 and 4 that the change of the weight of the aluminum material coated with alumite is greater than that of the aluminum material containing magnesium (Mg). In other words, the degree of the corrosion of the aluminum material coated with the alumite is rather progressed or greater than that of the aluminum material containing magnesium (Mg). In FIG. 3, the reference characters "○", "◇", and "⊙" designate the aluminum materials each of which is coated with the alumite. On the other hand, as shown in FIG. 4, the reference character "□" designates an aluminum material containing magnesium (Mg) of 0.2 to 2.8% in weight such as the 5052 alloy in the JIS. The reference character "♦" denotes an aluminum material containing magnesium (Mg) of 1.2 to 1.8% in weight such as the 2024 alloy in the JIS. The reference character "■" indicates an aluminum material containing magnesium (Mg) of 0.5% or less in weight, such as the 1050 alloy in the JIS. In FIG. 4, the three lines designated by the reference characters "□", "♦" and "■" overlap each other. In other words, there is approximately no change of the weight among these aluminum materials.

The part of the components in the plasma apparatus 100 of the embodiment 100 are made up of aluminum materials containing the magnesium based on the result of our study described above.

Specifically, the earth plate 5 or the earth electrode and the gas introduction ring 6 in the plasma apparatus 100 are made of an aluminum (Al) material containing magnesium (Mg) and which is not coated with the alumite, and the earth plate 5 and the gas introduction ring 6 are exposed to the plasma during the plasma etching process and the plasma cleaning process. The generation rate of the foreign matter during the plasma etching process and the plasma cleaning process in the plasma apparatus 100 can be reduced and it is lower than that of the conventional plasma apparatus as shown in FIG. 11.

In the plasma apparatus 100 of the embodiment shown in FIG. 1, there are no coatings such as alumite on the surfaces of the earth plate 5 and the gas introduction ring 6. We measure the number of aluminum atoms on the semiconductor wafer 8 per unit area as the degree of the contamination caused by the earth plate 5 and the gas introduction ring 6 in the plasma apparatus 100 under the same conditions as in the actual plasma etching process.

Figure 5:
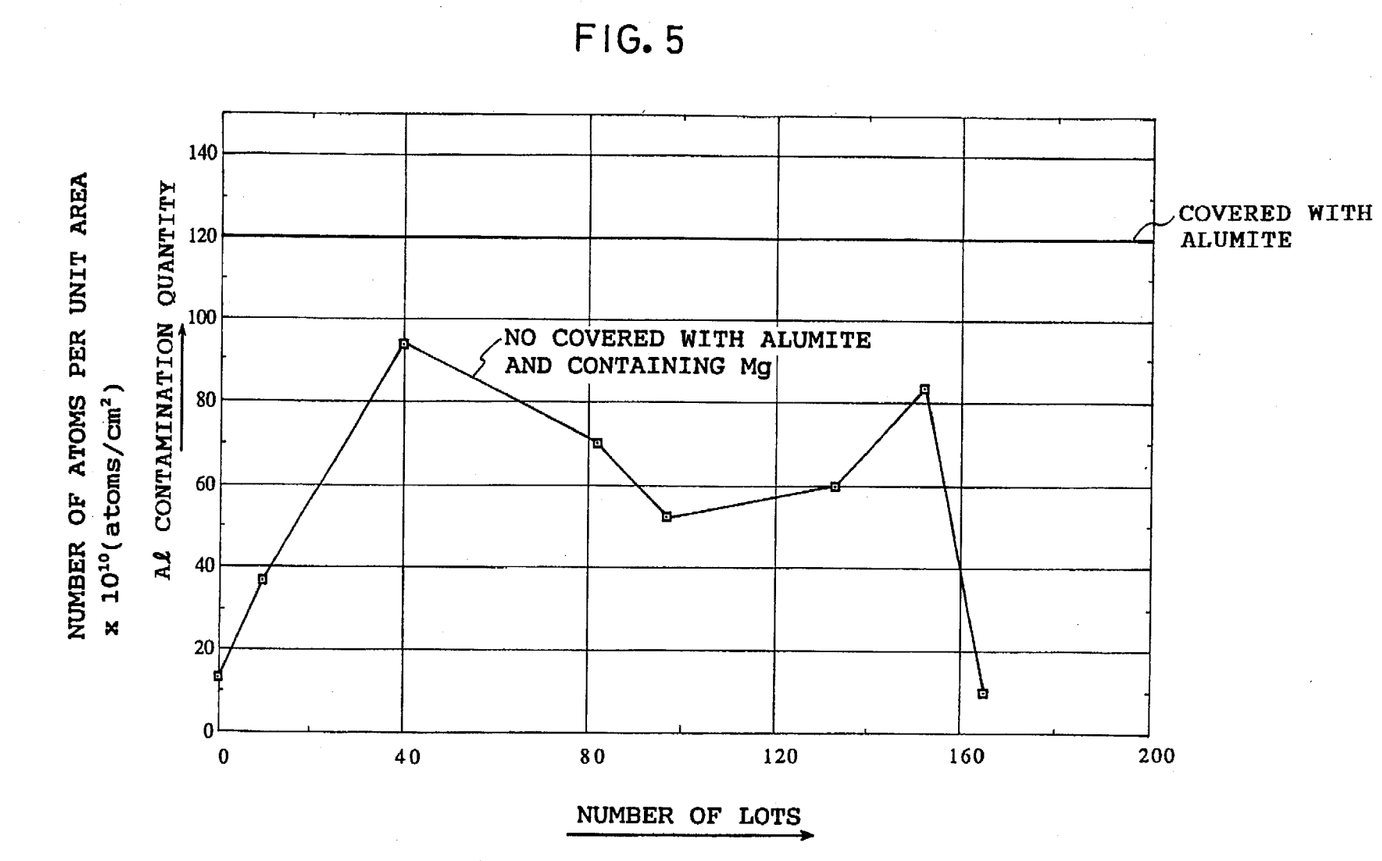
FIG. 5 is a diagram for comparing the number of aluminum atoms per unit area in the semiconductor wafer using two types of earth plates, one earth plate is made of aluminum containing a magnesium (Mg) and not coated with alumite and the other earth plate consists of an aluminum coated with alumite.

FIG. 5 is a diagram for comparing the number of aluminum atoms per unit area in a semiconductor wafer using two kinds of earth plates, one earth plate is made of a aluminum containing magnesium (Mg) and is not coated with aluminum and designated by the reference character "□" and the other earth plate consists of aluminum which is coated with alumite designated by the solid line. As clearly shown in FIG. 5, the contamination rate when the earth plate 5 comprising aluminum containing the magnesium and not coated with alumite according to embodiment 1 is almost equal to that of the earth plate 51 comprising aluminum coated with alumite in the conventional case. Accordingly, by using the plasma apparatus 100 of the embodiment 1 as shown in FIG. 1, the rate of corrosion in the earth plate and the gas introduction ring 6 can be reduced without increasing the rate of aluminum contamination. In practice, the test for detecting foreign matter is performed after a semiconductor device is formed on the semiconductor wafer 8. Specifically, the semiconductor wafer 8 is placed on the wafer stage 4, and the cleaning gas is introduced into the reaction chamber 20 during a predetermined time period, and then the amount of foreign matter on the semiconductor wafer 8 is detected. As a result, the ratio of the aluminum foreign matter to the total foreign matter on the semiconductor wafer 8 is approximately 40% when aluminum coated with alumite is used as the earth plate in the plasma apparatus. Conversely, the ratio of the aluminum foreign matter to the total foreign matter on the semiconductor wafer 8 is about 0 to several tens of % when aluminum containing magnesium which is not coated with alumite is used as the earth plate 5.

Figure 6:
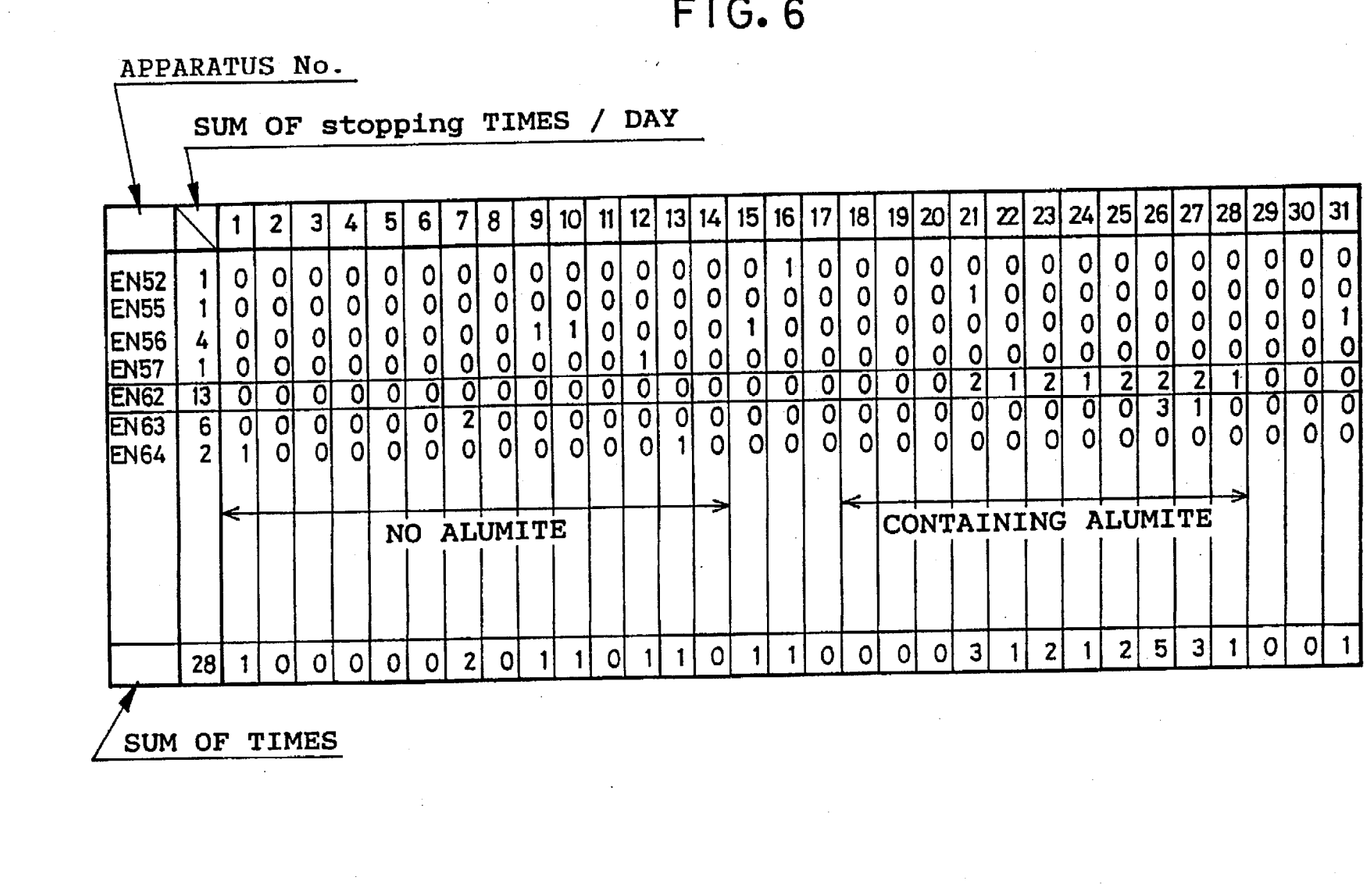
FIG. 6 is a diagram showing the number of the stopping times of each of plasma apparatus per day during a month.

FIG. 6 is an explanation diagram showing the number of stopping times of each of several plasma apparatus (EN52, 55, 56, 57, 62, 63 and 64) per day during a month. During one period (1 to 14 days shown in FIG. 6), the plasma apparatus has an earth plate, gas introduction ring, and the like consisting of aluminum containing magnesium (Mg) whose surfaces are not coated with alumite. In the other period (18 to 28 days shown in FIG. 6), the plasma apparatus has an earth plate, gas introduction ring, and the like made of the aluminum coated with alumite are used. The operation of the plasma apparatus EN62 is performed under the most strict condition in other plasma apparatus.

As clearly shown in FIG. 6, it is difficult to detect the completion time of the plasma etching process when the earth plate and the gas introduction ring are made of aluminum coated with alumite. In this case, the number of stopping times of the operation of the plasma apparatus detected until cleaning is required is greater than that of other cases in which aluminum containing magnesium is used for the earth plate, the gas introduction ring, and the like.

Further, the number of stopping times of the operation of the plasma apparatus detected until the plasma cleaning operation is performed under certain conditions, one condition using chloride trifluoride $ClF_3$ gas and the other using a sulfur hexafluoride ($SF_6$) gas as the plasma cleaning gas after the plasma etching process of one lot is completed. When using sulfur hexafluoride ($SF_6$) gas, the operation of the plasma apparatus is stopped many times after the processing of 40 lots is completed. Conversely, when using $ClF_3$ gas, operation of the plasma apparatus can be performed continuously without stopping the plasma etching operation even if the processing of 40 lots is completed.

As can be understood, when metal components such as the earth plate or the earth electrode 5, the gas introduction ring 6, and the like which are located in the plasma activation region in the reaction chamber 20 and exposed to the plasma are made of aluminum containing magnesium (Mg) and not coated with the alumite, the corrosion resistance to the halogen gasses, such as $Cl_2$, can be increased, so that $ClF_3$ having a strong reaction property can be used for the plasma cleaning process. As a result, the number of the lots to be processed can be increased before the plasma apparatus is stopped because it is difficult to detect the completion of the plasma etching process. In other words, the frequency of the periodic maintenance is decreased. Although $ClF_3$ is used in this embodiment as the plasma cleaning gas, the present invention is not limited to this. For example, strong reaction, such as a gas including bromine (Br), nitrogen fluoride ($NF_3$) nitrogen fluoride and fluorine ($NF_3+F_2$) and the like instead of $ClF_3$ can be used as the plasma cleaning gas.

EMBODIMENT 2

Figure 7:
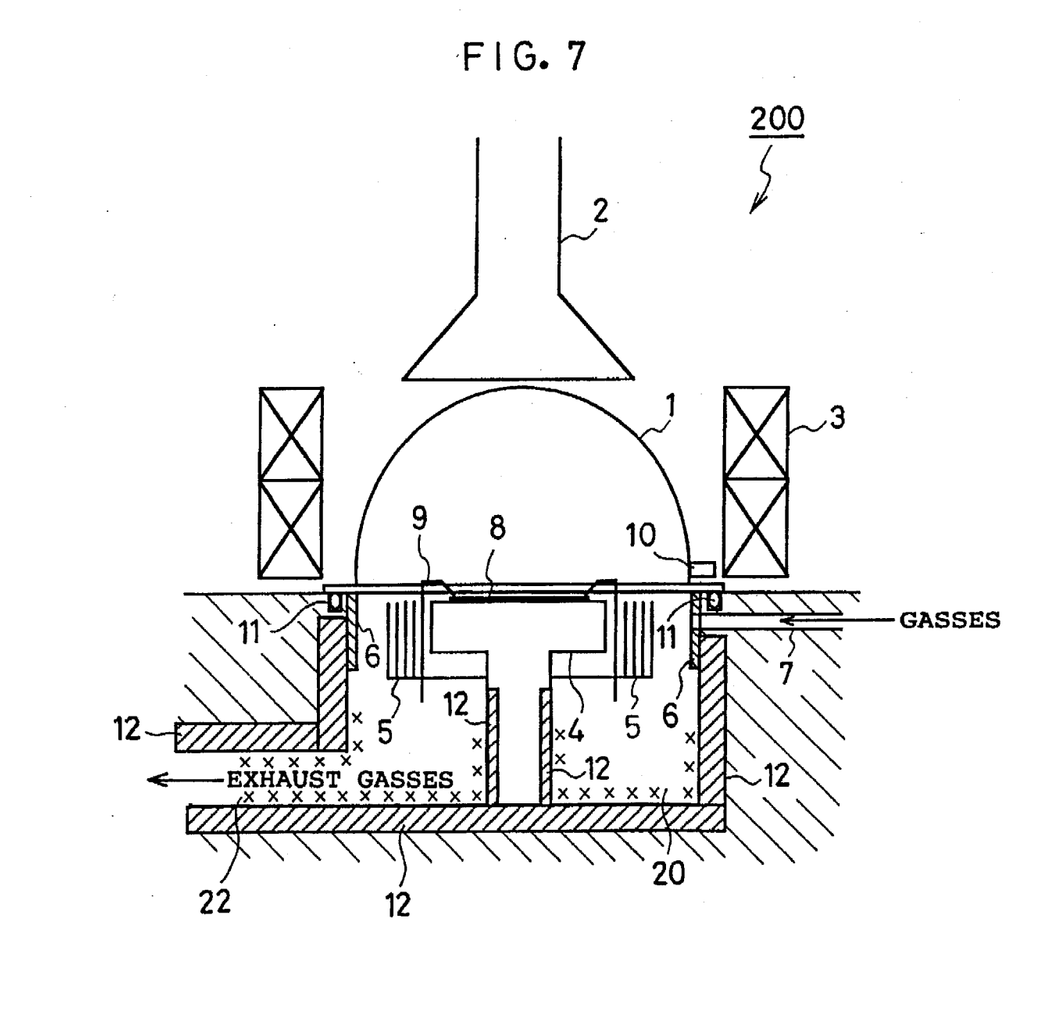
FIG. 7 is a sectional view showing a plasma apparatus of an embodiment according to the present invention.

FIG. 7 is a sectional view showing a plasma apparatus 200 of an embodiment 2 according to the present invention.

In FIG. 7, a reference number 12 designates a heater (heating means) for heating the lower section of the reaction chamber 20. Other components in the plasma apparatus 200 are same as the components of the plasma apparatus 100 in configuration and function as shown in FIG. 1. Therefore explanation of the operation and the configuration of the components other than the heater 12 is omitted here.

The operation of the plasma apparatus 200 is basically the same as the operation of the plasma apparatus 100 of embodiment 1. The difference is that the lower section of the reaction chamber 20 is heated by the heater 20 during the plasma cleaning process.

When the plasma etching process is performed, the reaction products adhered to the lower section designated by the reference character "x" of the reaction chamber 20 which is opposite from the upper section including the semiconductor wafer 8, the earth plate 5, the gas introduction ring 6 and the like. The reaction products adhered to the lower section designated by the reference character "x" must be eliminated by the plasma cleaning process. However, the heat produced by plasma electrical discharge can not affect the lower section designated by the reference character "x" shown in FIG. 7. Accordingly, the plasma cleaning rate at the lower section becomes low. In order to avoid this, the lower section designated by the reference character "x" is heated by the heater 12. The heating temperature for the lower section is more than 300° C. Thus, the heating by using the heater 12 during the plasma cleaning process can eliminate effectively the reaction products adhered to the lower section of the reaction chamber 20.

EMBODIMENT 3

Figure 8:
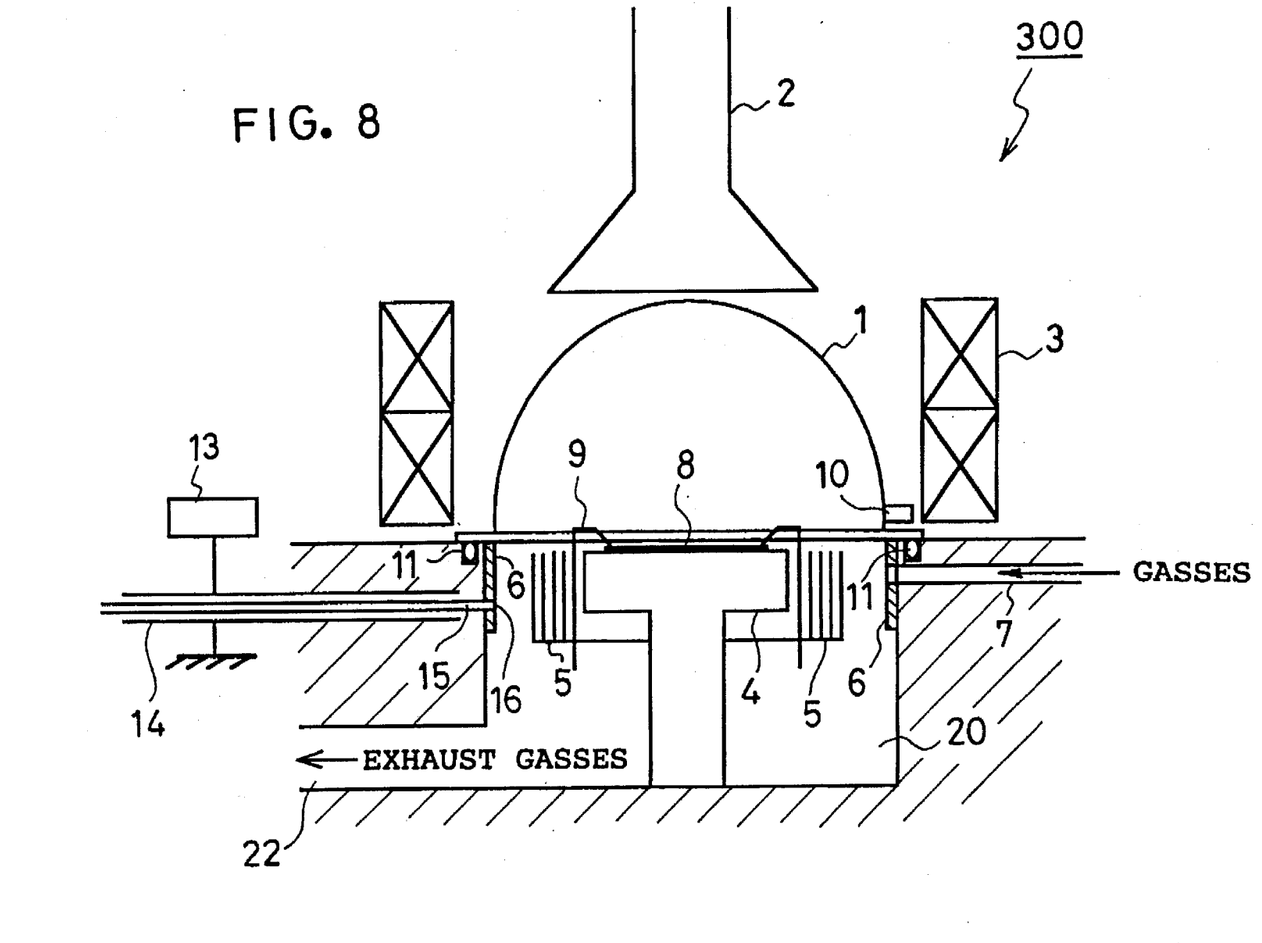
FIG. 8 is a sectional view showing a plasma apparatus of an embodiment according to the present invention.

FIG. 8 is a sectional view showing a plasma apparatus 300 of an embodiment 3 according to the present invention. In FIG. 8, a reference number 13 designates a high frequency power source, a reference number 14 denotes an electrode connected to the high frequency power source 13. A reference number 15 designates an electrical discharge chamber in which the plasma discharge process is carried out and the electrical discharge room 15 is located between the high frequency power source 13 and the electrode 14. A reference number 16 designates a hole through which the plasma generated in the electrical discharge chamber 15 is supplied to the reaction chamber 20. The plasma supply means includes the high frequency power source 13, the electrode 14, the electrical discharge chamber and the hole 16. Components other than the components designated by the reference numbers 13, 14, 15, and 16 in the plasma apparatus 300 are same as the components in the plasma apparatus 100 and the explanations of them are therefore omitted.

During the plasma cleaning process, the plasma generated in the electrical discharge chamber 15 is provided to the lower section of the reaction chamber 20 through the hole 16.

We have already described in the explanation of embodiment 2 that it is difficult to heat the lower section designated by the reference character "x" in the reaction chamber 20 only by the plasma discharge and so the rate of the plasma cleaning is lower. In addition, the radicals used for the plasma cleaning process can not be supplied to the lower section in the reaction chamber 20 because almost all of the radicals are used at the upper section of the reaction chamber 20. In order to increase the rate of the plasma cleaning for the reaction chamber 20, the temperature of the reaction chamber 20 must be increased to more than 300° C. However, in this case, the corrosion resistance of each of the components such as the earth plate 5 and the gas introduction ring 6 in the reaction chamber 20 is reduced. In order to avoid this, during the plasma cleaning process, the plasma is generated in the electrical discharge chamber 15, and then the generated plasma is supplied to the lower section of the reaction chamber 20 through the hole 16. Thereby, radicals in the plasma state capable of cleaning are provided adequately to the lower section in the reaction chamber 20 and the reaction products adhered to the surface of the lower section in the reaction chamber 20 can be eliminated efficiently during the plasma cleaning process.

EMBODIMENT 4

Figure 9:
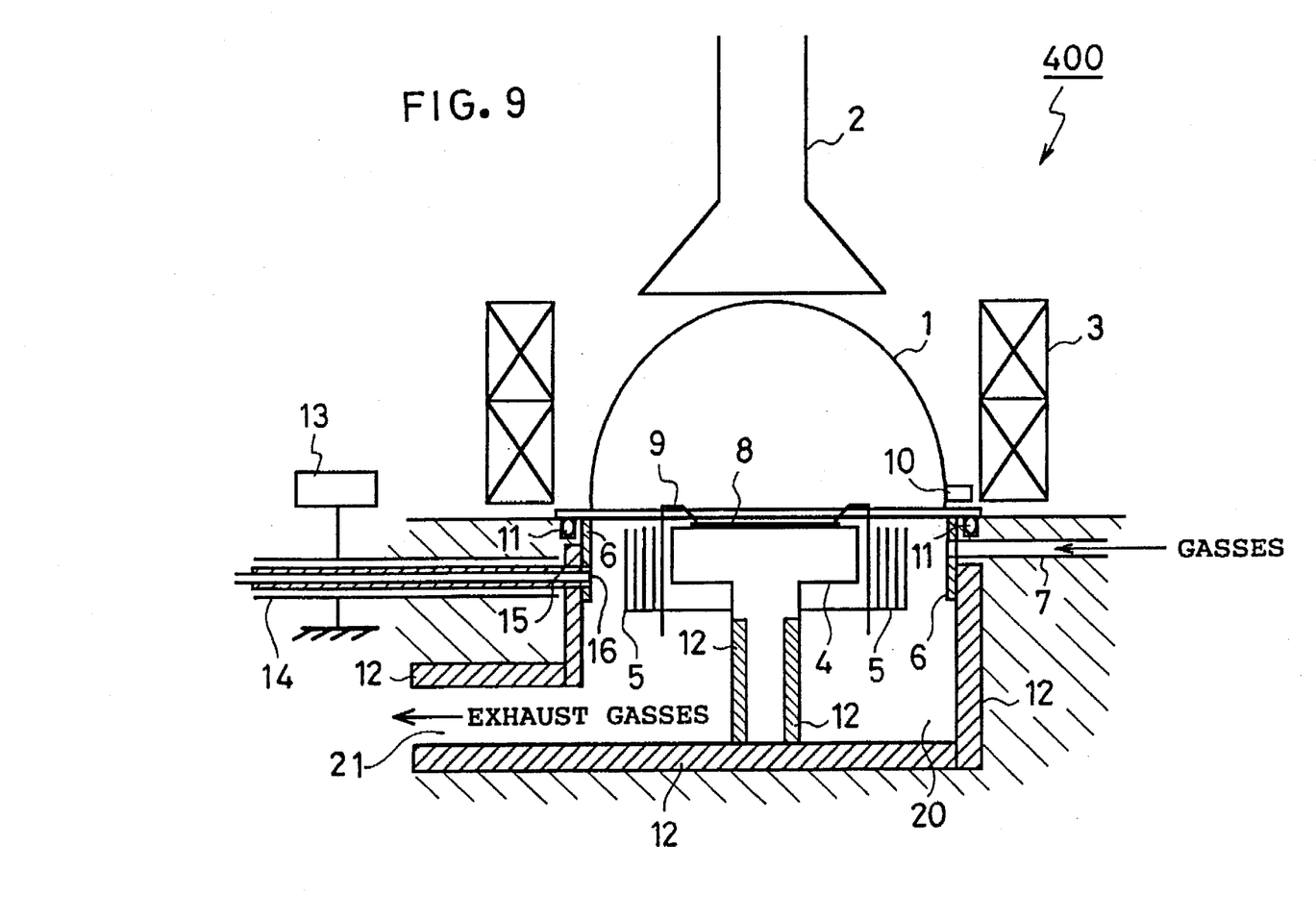
FIG. 9 is a sectional view showing a plasma apparatus of an embodiment according to the present invention.

FIG. 9 is a sectional view showing a plasma apparatus of an embodiment 4 according to the present invention. In FIG. 9, a reference number 12 designates a heater for heating the lower section of the reaction chamber 20, a reference number 13 designates a high frequency power source located out-side of the reaction chamber 20, a reference number 14 denotes an electrode connected to the high frequency power source 13. A reference number 15 designates an electrical discharge chamber in which a plasma discharge process is carried out. The electrical discharge chamber 15 is located between the high frequency power source 13 and the electrode 14. A reference number 16 designates a hole through which the plasma generated in the electrical discharge chamber 15 is supplied to the reaction chamber 20. Components other than the components designated by the reference numbers 12, 13, 14, 15, and 16 in the plasma apparatus 300 are same as the components of the plasma apparatus 100 in configuration and function and explanations of them are therefore omitted here.

In the plasma apparatus 400 of the embodiment 4, during the plasma cleaning process, the plasma generated in the electrical discharge chamber 15 is supplied to the lower section of the reaction chamber 20. In addition, the lower section of the reaction chamber 20 is heated by the heater 12. The lower section of the reaction chamber 20 indicates the outside section of the plasma activation section which includes the semiconductor wafer 8, the earth plate 5, and the gas introduction ring 6.

The temperature of the lower section of the reaction chamber 20 is lower than that of the upper section in the reaction chamber 20 which is directly exposed to the plasma discharge. The upper section is the plasma activation section including the semiconductor wafer 8, the earth plate 5 and the gas introduction ring 6. Accordingly, the cleaning rate of the lower section in the reaction chamber 20 is lower than that of the upper section even if the plasma is supplied from the electrical discharge chamber 15 which is of the reaction chamber 20. In order to avoid this, during the plasma cleaning process, the plasma generated in the electrical discharge chamber 15 is supplied to the lower section in the reaction chamber 20 through the hole 16 in addition to heating the lower section with heater 12. Thereby, the efficiency of the plasma cleaning process for the reaction chamber 20 can be increased. In addition, the corrosion resistance of the components such as the earth plate 5, the gas introduction ring 6, and the like in the reaction chamber 20 is not decreased, so the generation of the foreign matter from the earth plate 5 and the gas introduction ring 6 can therefore be prevented.

EMBODIMENT 5

In the reaction chamber 20, foreign products are generated from the components outside of the plasma activation section in addition to inside the plasma activation section. It is also important to reduce the generation of foreign matter from outside of the plasma activation section during a semiconductor fabrication process. In the description of the embodiments 1 to 4, it is required to heat the lower section of the reaction chamber 20 in order to increase the efficiency of the plasma cleaning process. However, when the temperature of the reaction chamber 20 is increased, the corrosion resistance of the components in the reaction chamber 20 is decreased.

Figure 10:
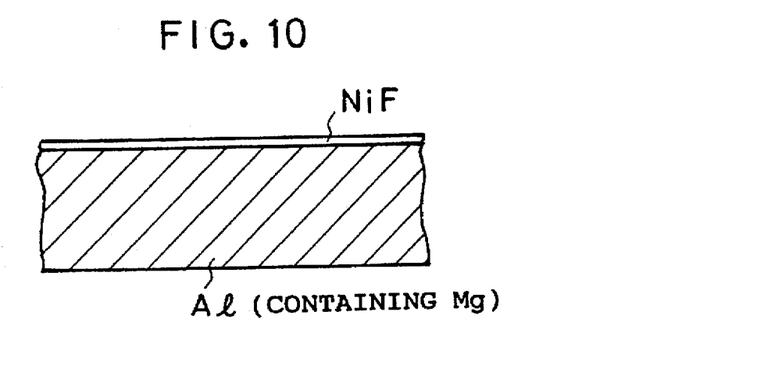
FIG. 10 is a sectional view of a component which is made of aluminum containing magnesium (Mg) and coated with a NiF film in the plasma apparatus of the present invention.

FIG. 10 is a sectional view of a component which is made of aluminum containing magnesium (Mg) whose surface is coated with a nickel fluoride (NiF) film in the plasma apparatus of the present invention.

As shown in FIG. 10, the surface of the component of the aluminum (Al) containing magnesium (Mg) is coated with the NiF film. The aluminum material of the component shown in FIG. 10 is used for the components out-side of the plasma activation section in the reaction chamber 20, namely in the lower section in the reaction chamber 20. In other words, the surfaces of the components of the aluminum material containing magnesium (Mg) outside of the plasma activation section are coated with the NiF film. In this case, during the plasma cleaning process, even if the lower section of the reaction chamber 20 is heated to more than 300° C. by the heater 12, the corrosion resistance of the components in the lower section of the reaction chamber 20 is not decreased. Specifically, it is better for the components in the lower section of the reaction chamber 20 or out-side of the plasma activation section to use the aluminum material containing magnesium in a concentration of 2.2 to 2.8% by weight coated with the NiF film. There is no problem that the plasma cleaning process is carried out while heating the components out-side of the plasma activation section with heater 12. In fact, we confirmed that almost no foreign matter from the aluminum material is generated when the components out-side of the plasma activation section are coated with the NiF film.

As described above in detail, in plasma apparatus according to the present invention, because the components such as the earth plate 5 and the gas introduction ring 6 which are exposed to a plasma are made of aluminum (Al) containing magnesium (Mg) and not coated with alumite, the generation of foreign matter from the components is decreased when a plasma etching process and a plasma cleaning process are carried out using gasses including chlorine (Cl) and bromine (Br). In addition, the yield of semiconductor chips in a semiconductor fabrication process can be increased, and the operating efficiency of the plasma apparatus of the present invention can be increased by decreasing the frequency of the periodic maintenance of the plasma apparatus. In periodic maintenance, operation of the plasma apparatus is stopped.

In addition, in plasma apparatus according to the present invention, components such as the earth plate 5 and the gas introduction ring 6 which are exposed to a plasma are made of aluminum containing magnesium (Mg) in a concentration of of of 2.2 to 2.8% by weight whose surface is free of coatings. Accordingly, the generation of the foreign matter from the components is decreased when a plasma etching process and a plasma cleaning process are carried out by using gasses including Cl and Br. In addition, the yield of semiconductor chips in a semiconductor fabrication process can be increased, and the operating efficiency of the plasma apparatus can be increased by decreasing the frequency of periodic maintenance of the plasma apparatus. The periodic maintenance stops completely the normal operation of the plasma apparatus.

In addition, in a plasma apparatus of the present invention, because the heating means (the heater 12) for heating the lower section in the reaction chamber is incorporated in the plasma apparatus, the speed of the plasma cleaning process in the lower section, where it is difficult to transmit efficiently the heat generated by the plasma, can be increased, so that the time required for the plasma cleaning process in the reaction chamber can be reduced.

In addition, because the plasma apparatus of the present invention further comprises a plasma supply means for supplying radicals generated by the plasma in the reaction chamber during the plasma cleaning process, the radicals can be supplied outside of the plasma activation section (i.e., the lower section) in the reaction chamber, so that the efficiency of the plasma cleaning process for the lower section in the reaction chamber can be increased and the frequency and the time required for the plasma cleaning process in the reaction chamber can be reduced Furthermore, in the plasma apparatus of the present invention, because the surface of components comprising aluminum containing magnesium located outside of the plasma activation section (i.e., the lower section of the reaction chamber) is coated with an NiF film having stronger corrosion resistance, the generation of the foreign matter from these components can be reduced. In particular, when the heating means (i.e., the heater) is further incorporated in the plasma apparatus, the generation of foreign matter from the components placed outside of the plasma activation section can be reduced even if the temperature in the reaction chamber is more than 300° C. in order to increase the effect of the plasma cleaning process.

Moreover, in the plasma apparatus of the present invention, because strong reaction gasses such as $ClF_3$, $ClF_3$ including Br, $NF_3$, $NF_3+F_2$ and the like are introduced into the reaction chamber for the plasma cleaning, in addition to the use of the aluminum containing magnesium for the components which are exposed to the plasma, the generation of the foreign matter from the components can be reduced and the efficiency of the plasma cleaning process can be increased.

What is claimed is:

1. A plasma apparatus for plasma etching comprising:
   a reaction chamber;
   plasma generation means for generating a plasma in said reaction chamber;
   a wafer stage in said reaction chamber and on which a semiconductor wafer may be mounted; and
   gas supply means for supplying gases to said reaction chamber wherein metal components exposed to the plasma in said reaction chamber are made of aluminum containing magnesium and are free of surface coatings.

2. The plasma apparatus according to claim 1 wherein:
   said plasma generation means comprises a waveguide for transmitting microwave energy to said reaction chamber and an earth electrode located opposite said waveguide;

said gas supply means comprises a gas introduction pipe for introducing gases into said reaction chamber and a gas introduction ring having a plurality of holes through which the gases are supplied to said reaction chamber, said gas introduction ring being connected to said gas introduction pipe; and said earth electrode and said gas introduction ring are made of aluminum containing magnesium and surfaces of said earth electrode and said gas introduction ring are free of coatings.

3. The plasma apparatus according to claim 1 wherein said metal components are made of aluminum containing magnesium in a concentration of 2.2 to 2.8% by weight.

4. The plasma apparatus according to claim 2 wherein said earth electrode and said gas introduction ring are made of aluminum containing magnesium in a concentration of 2.2 to 2.8% by weight.

5. The plasma apparatus according to claim 1 further comprising heating means for heating, when plasma cleaning is carried out, a section other than a plasma activation section where plasma etching has been performed in said reaction chamber.

6. The plasma apparatus according to claim 1 comprising plasma supply means for establishing a plasma discharge and for generating radicals in the plasma discharge and providing the radicals to said reaction chamber during plasma cleaning.

7. The plasma apparatus according to claim 1 wherein components located in a section other than where plasma etching is performed in said reaction chamber are made of aluminum containing magnesium and coated with a nickel fluoride film.

8. The plasma apparatus according to claim 1 wherein a cleaning reaction gas is supplied to said reaction chamber through said gas supply means during plasma cleaning.

9. The plasma apparatus according to claim 8 wherein said gas supply means provides one of chlorine trifluoride, chlorine trifluoride including bromine, nitrogen fluoride, and a mixture of nitrogen fluoride and fluorine as the cleaning reaction gas.

* * * * *